US006665212B1

United States Patent
Fan et al.

(10) Patent No.: US 6,665,212 B1
(45) Date of Patent: *Dec. 16, 2003

(54) REFERENCE CURRENT GENERATING CIRCUIT OF MULTIPLE BIT FLASH MEMORY

(75) Inventors: Tso-Hung Fan, Taipei Hsien (TW); Chih-Chieh Yeh, Taipei (TW); Tao-Cheng Lu, Kaoshiung (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 10/065,032

(22) Filed: Sep. 12, 2002

(51) Int. Cl.⁷ ................................................. G11C 16/06
(52) U.S. Cl. .............................. 365/185.2; 365/185.18; 365/189.09
(58) Field of Search ......................... 36/185.2, 185.18, 36/189.09, 185.33, 185.27, 210

(56) References Cited

U.S. PATENT DOCUMENTS 6,434,049 B1 * 8/2002 Trivedi et al. ............ 365/185.2

* cited by examiner

*Primary Examiner*—David Lam
(74) *Attorney, Agent, or Firm*—Jiang Chyun IP Office

(57) ABSTRACT

The reference current generation circuit of a multiple bit flash memory. An identical boosted word-line voltage is applied to the gate terminal of reference memory cells in different reference current generation units and a different substrate voltage is applied to the substrate of each reference memory cell so that different reference currents are produced. This arrangement reduces different degree of shifting in the reference currents due to temperature and source voltage Vcc variation.

6 Claims, 3 Drawing Sheets

REFERENCE CURRENT GENERATING CIRCUIT OF MULTIPLE BIT FLASH MEMORY

BACKGROUND OF INVENTION

1. Field of Invention

The present invention relates to a multiple bit flash memory. More particularly, the present invention relates to the reference current generating circuit of a multiple bit flash memory.

2. Description of Related Art

Flash memory is a multiple program, read and erase non-volatile memory. Since stored data will not disappear after removing the power and content can be easily erased and changed through programming, most electronic equipment such as the personal computer adopts this device.

A typical flash memory includes a large number of flash memory cells with each flash memory cell capable of holding one bit of data. In general, a flash memory cell structure has a floating gate and a control gate made from doped polysilicon. The floating gate and the control gate are isolated from each other through a dielectric layer. Moreover, the floating gate is isolated from the substrate through a tunnel oxide layer. To write data into or erase data from a flash memory cell, a bias voltage is applied to the control gate and the drain terminal so that electrons are injected into the floating gate or electrons are pulled out from the floating gate. To read data from the flash memory cell, a word line voltage is applied to the control gate. The charge-up state of the floating gate has a direct effect on the on/off state of the channel underneath. According to the on/off state of the channel, logic state such as logic "0" or "1" in the flash memory cell can be determined.

Following the rapid progress in technologies and an impending demand for a flash memory with a higher storage capacity, a type of multiple bit flash memory has been developed. In other words, each flash memory cell is capable of holding at least two bits of data. To read data from this type of flash memory cell, the read-out current must be compared with a reference current before the value actually stored inside the memory cell can be determined.

FIG. 1 is a threshold voltage distribution diagram of a conventional 2-bit flash memory cell. In FIG. 1, the horizontal axis represents size of the threshold voltage $V_{th}$ while the vertical axis represents the number of flash memory cells having the threshold voltage $V_{th}$. In general, the number of flash memory cells within a definite range of threshold voltage $V_{th}$ will follow a Gaussian distribution as shown in FIG. 1. To erase data from the flash memory cell, the threshold voltage $V_{th}$ is below EV. To write a data value "01" into the flash memory cell, the threshold voltage $V_{th}$ is between $PV_1$ to below $R_2$. To write a data value "10" into the flash memory cell, the threshold voltage $V_{th}$ is between $PV_2$ and below $R_3$. Finally, to write a data value "11" into the flash memory cell, the threshold voltage $V_{th}$ is above $PV_3$. Hence, a word line voltage EV is applied to the control gate to erase data from the flash memory cell and the read-out current is gauged to determine if the erasing operation is complete. To write data values "01", "10", "11" into the flash memory cell, word line voltages $PV_1$, $PV_2$ and $PV_3$ are applied to the control gate respectively and the read-out current is gauged to determine if the write-in operation is complete. To read stored data value from the flash memory cell, word line voltages $R_1$, $R_2$ and $R_3$ are applied to the control gate respectively and the read-out current is gauged to determine if the read-out operation is complete. Meanwhile, the read-out current and a reference current produced by a reference current generation circuit are compared to determine the actual read-out data value.

In general, a conventional reference current generation circuit generates a reference current through the application of boosted word-line voltage (BWLV) at different levels to the gate terminal of different reference cells. For example, the aforementioned 2-bit flash memory cell must include EV, $PV_1$, $PV_2$, $PV_3$, $R_1$, $R_2$ and $R_3$. In other words, altogether 7 different levels of word line voltages and hence 7 different boosted word-line voltages are required for the execution of erase verify, program verify and read operations. If a 3-bit flash memory cell is used, boosted word-line voltage at 15 different levels are required. Since various boosted word-line voltages may change in response to temperature or power source voltage $V_{CC}$, various reference currents produced by the reference current generation circuit are likely to shift in value in accordance to any change in temperature and source voltage $V_{cc}$.

SUMMARY OF INVENTION

Accordingly, one object of the present invention is to provide a reference current generation circuit capable of reducing current shift due to a change in temperature and source voltage $V_{CC}$.

To achieve these and other advantages and in accordance with the purpose of the invention, as embodied and broadly described herein, the invention provides a reference current generation circuit for a multiple bit flash memory. The reference current generation circuit includes a plurality of reference current generation units with each reference current generation unit comprising a loading and a reference memory cell. The loading has a first terminal and a second terminal. The first terminal of the loading is connected to an operating power source and the second terminal of the loading is connected a first source/drain terminal of the reference memory cell. A second source/drain terminal of the reference memory cell is connected to a ground terminal and the gate terminal of the reference memory cell is connected to a boosted word-line voltage. The substrate of the reference memory cell is connected to a substrate voltage. The gate terminal of each reference current generation unit is connected to an identical boosted word-line voltage and the substrate voltage to the substrate of each reference current generation unit will differ according to the size of reference current produced by the reference current generation unit.

In one embodiment of this invention, the reference memory cell is a dummy cell. The so-called dummy cell is formed by joining together the floating gates and control gates of flash memory cells, each one having an identical structure, inside a multiple bit flash memory cell. To realize the properties of a reference memory cell in full, the gate of the reference memory cell has a length and width greater than that of the flash memory cell of the multiple bit flash memory. For example, the length and width of the gate of the reference memory cell has a dimension 1 $\mu$m×1 $\mu$m by design.

To improve the properties of reference memory cells even further, each reference memory cell in excess of the number required to form the reference current generation unit is fabricated inside the same layout bank. The reference current is generated using a single reference memory cell or a plurality of identical reference memory cells. Furthermore, to produce the reference current using identical reference memory cells within the same bank, all the reference memory cells are connected together in parallel.

According to the aforementioned explanation, this invention provides a reference current generation circuit that applies an identical boosted word-line voltage to the gate terminal of different reference memory cells. Moreover, different substrate voltages are applied to the substrate of reference memory cells. Hence, the degree of shifting of the reference current due to a change in temperatures and/or the power source voltage $V_{CC}$ is greatly reduced.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1:
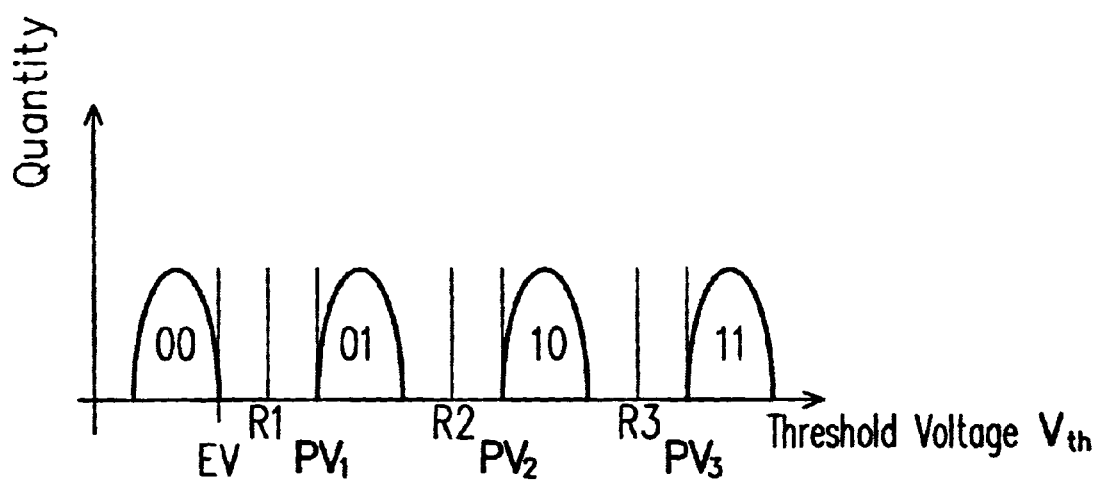
FIG. 1 is a threshold voltage distribution diagram of a conventional 2-bit flash memory cell.

Reference will now be made in detail to the present preferred embodiments of the invention, examples of which are illustrated in the accompanying drawings. Wherever possible, the same reference numbers are used in the drawings and the description to refer to the same or like parts.

Figure 2:
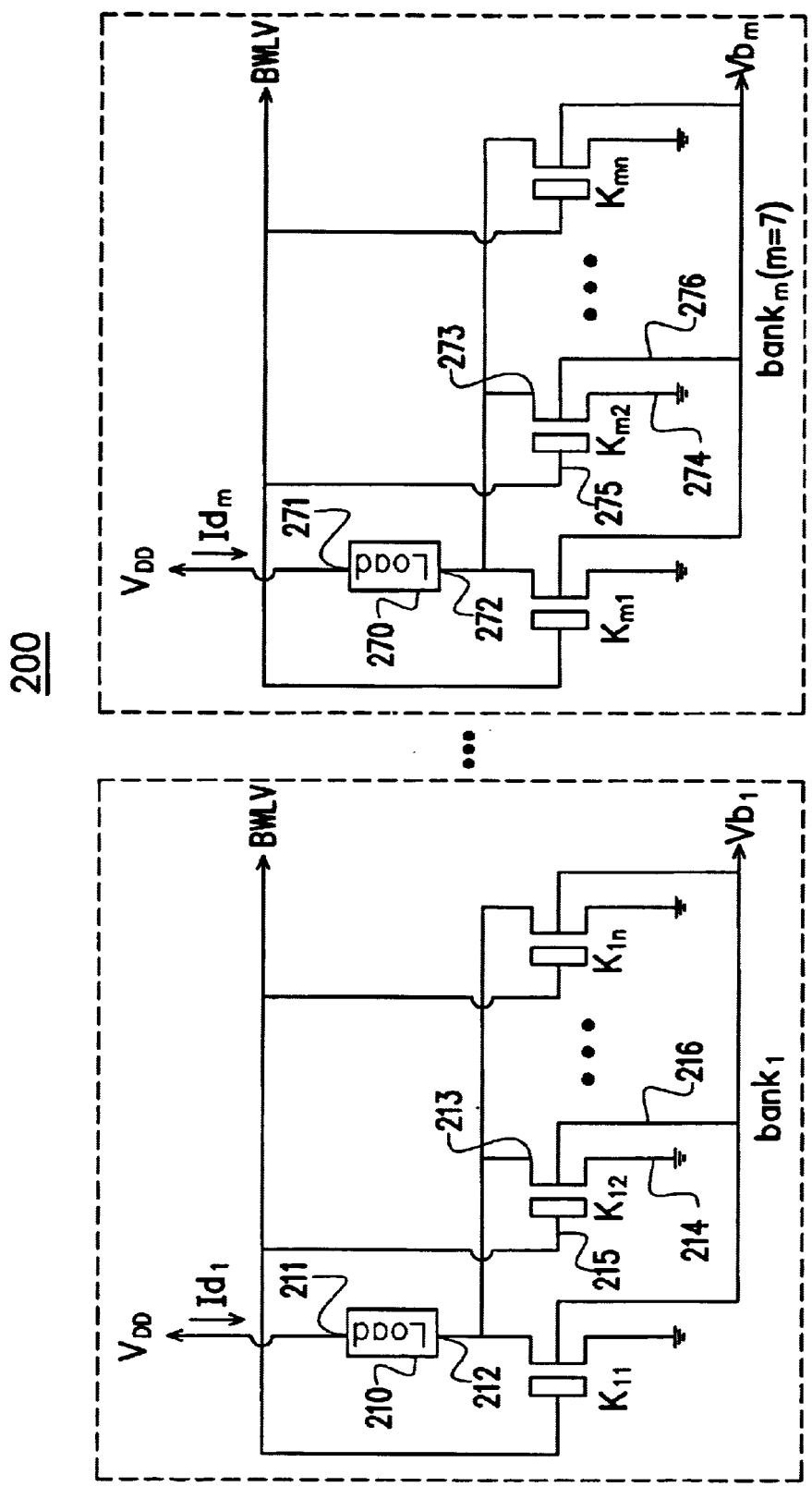
FIG. 2 is a schematic diagram of a reference current generation circuit designed according to one preferred embodiment of this invention.

FIG. 2 is a schematic diagram of a reference current generation circuit designed according to one preferred embodiment of this invention. In FIG. 2, the reference current generation circuit 200 includes m reference current generation units bank1~bankm. Here, the value of m depends on the number of bits used in the flash memory cells of the multiple flash memory. For example, a 2-bit flash memory cell has an m-value equal to 7 while a 3-bit flash memory cell has an m-value equal to 15. The value of m for a flash memory cell of whatever number of bits can be similarly calculated. A 2-bit flash memory cell with m=7 is used as an example in the following illustration.

For a 2-bit flash memory cell, there are altogether 7 reference current generation units bank1~bank7. The reference current generation unit (bank1) includes a loading 210 and reference memory cells $k_{11}$~$k_{1n}$ connected in parallel. Similarly, the reference current generation unit (bank7) includes a loading 270 and reference memory cells $k_{71}$~$k_{7n}$ connected in parallel. The structures of other reference current generation units (bank2~bank6 and not drawn) are identical.

The reference memory cells $k_{11}$~$k_{7n}$ are, for example, dummy cells. In other words, the floating gate and the control gate of the flash memory cells in the multiple bit flash memory all having an identical structure are connected together. In general, it is easier to control the properties of a gate having a larger design dimension.

Therefore, more accurate reference currents can be obtained by controlling the properties of the reference cells $k_{11}$~$k_{7}$. One way of controlling the properties is to fabricate the gate channels of the reference memory cells $k_{11}$~$k_{7n}$ with a length and width greater than that of the gate channel of the flash memory cells in the multiple bit flash memory. For example, while the multiple bit flash memory is fabricated using a feature line width of 0.18 μm, length and width of the gate channel of the reference memory cells $k_{11}$~$k_{7n}$ can be manufactured using a dimension of about 1 μm.

Properties of the reference memory cells $k_{11}$~$k_{7n}$ can be further improved through layout design. The reference memory cells $k_{11}$~$k_{7n}$ of each reference current generation unit (bank1~bank7) may be individually fabricated within the same layout bank. In other words, all the reference memory cells $k_{11}$~$k_{7n}$ are manufactured in the same layout bank while all the reference memory cells $k_{71}$~$k_{7n}$ are manufactured in another layout bank. In addition, each layout bank uses the reference cells at the boundary of the non-layout bank so that variation of properties due to boundary effect is reduced.

As shown in FIG. 2, the loading 210 of the reference current generation unit (bank1) has a first connection terminal 211 and a second connection terminal 212. The first connection terminal 211 is connected to an operating power source $V_{DD}$. The second connection terminal 212 is connected to the first source/drain terminal 213 of the parallel-connected reference memory cells $k_{11}$~$k_{1n}$ and the second source/drain terminal 214 of the parallel-connected reference memory cells $k_{11}$~$k_{1n}$ are connected to a ground terminal. The gate terminal 215 of each reference cell ($k_{11}$~$k_{1n}$) is connected in parallel to a boosted word-line voltage (BWLV) line and the substrate terminal 216 of each reference cell ($k_{11}$~$k_{1n}$) is connected in parallel to a substrate voltage $Vb_1$ terminal to produce a reference current $Id_1$.

Similarly, the loading 270 of the reference current generation unit (bank7) has a first connection terminal 271 and a second connection terminal 272. The first connection terminal 271 is connected to an operating power source $V_{DD}$. The second connection terminal 272 is connected to the first source/drain terminal 273 of the parallel-connected reference memory cells $k_{71}$~$k_{7n}$ and the second source/drain terminal 274 of the parallel-connected reference memory cells $k_{71}$~$k_{7n}$ are connected to a ground terminal. The gate terminal 275 of each reference cell ($k_{71}$~$k_{7n}$) is connected in parallel to a boosted word-line voltage (BWLV) line and the substrate terminal 276 of each reference cell ($k_{71}$~$k_{7n}$) is connected in parallel to a substrate voltage $Vb_7$ terminal to produce a reference current $Id_7$.

Figure 3:
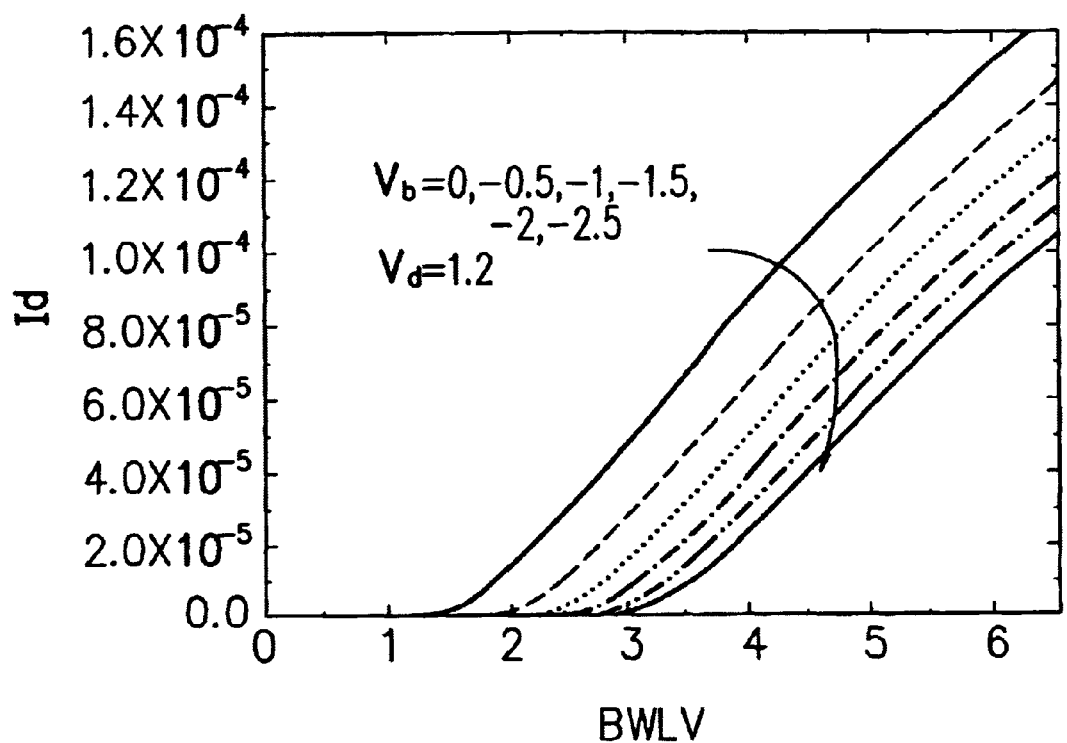
FIG. 3 is a graph showing the reference current curves for a reference current generation circuit designed according to one preferred embodiment of this invention.

Since parallel-connected gate (215~275) of the current generation units (bank1~bank7) are connected to the same boosted word-line voltage (BWLV) terminal, the generated reference current (Id) and the gate width (W), the gate length (L), the boosted word line voltage (BWLV) and the threshold voltage (Vth) are related to each other by the following relationship: Id≈W/L(BWLV-Vth). In this embodiment, the gate width (W) and the gate length (L) of each reference memory cell ($k_{11}$~$k_{7n}$) has the same design. Furthermore, the threshold voltage Vth is proportional to its substrate voltage Vb. Hence, by connecting the substrate of each reference current generation unit (bank1~bank7) to different substrate voltage $Vb_1$~$Vb_7$ according to required sizes of the reference currents $Id_1$~$Id_7$, for example, the substrate voltages 0 V, –0.5 V, –1 V, –1.5 V, –2 V, –2.5 V and 3 V, the reference currents $Id_1$~$Id_7$ are obtained as shown in FIG. 3.

Although each reference current generation unit (bank1~bank7) utilizes a plurality of identical reference memory cells $k_{11}$~$k_{1n}$ . . . $k_{71}$~$k_{7n}$ to generate different reference currents $Id_1$~$Id_7$, their average values may actually be used as the reference currents $Id_1$~$Id_7$. In addition, one may select only one reference memory cell in each reference current generation unit (bank1~bank7) to generate the respective reference currents $Id_1$~$Id_7$. For example, only the reference memory cell $k_{11}$ in the reference current generation unit (bank1) is used to generate the reference current $Id_1$ and only the reference memory cell $k_{71}$ in the reference current generation unit (bank7) is used to generate the reference current $Id_7$. None of the other reference cells are incorporated into the reference current generation circuit.

In conclusion, major advantages of this invention include:

1. Since the same boosted word line voltage is applied to the gate terminal of different reference memory cells and different substrate voltages are applied to the substrate of reference memory cells, reference currents at different levels are produced. Consequently, shift in reference currents due to temperature and source voltage Vcc variation is greatly reduced.

2. Since the length and width of channel gate of the reference memory cells are non-critical dimensions and one or all the reference memory cells in the same layout bank are used to generate the reference currents, properties of each reference memory cell can be designed with great accuracy.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A reference current generation circuit for a multiple bit flash memory having a plurality of reference current generation units, each reference current generation unit comprising:

a loading having a first connection terminal and a second connection terminal, wherein the first terminal is connected to an operating power source; and a reference memory cell having a substrate terminal, a gate terminal, a first source/drain terminal and a second source/drain terminal, wherein the first source/drain terminal is connected to the second connection terminal of the loading, the second source/drain terminal is connected to ground, the gate terminal is connected to a boosted word-line voltage terminal and the substrate terminal is connected to a substrate voltage terminal;

wherein the gate terminal of each reference current generation unit is connected to an identical boosted word-line voltage terminal and the substrate voltage supplied to the substrate terminal of each reference current generation unit depends on the size of reference current that needs to be generated by the reference current generation unit.

2. The reference current generation circuit of claim 1, wherein the reference memory cell is a dummy memory cell.

3. The reference current generation circuit of claim 1, wherein the length and width of the gate channel of the reference memory cells has a greater dimension than the length and width of the gate channel of the flash memory cells in a multiple bit flash memory.

4. The reference current generation circuit of claim 3, wherein the length and width of the gate channel of the reference memory cell has a dimension of about 1 μm.

5. The reference current generation circuit of claim 1, wherein the reference memory cell is one of the reference memory cells located inside the same layout bank.

6. The reference current generation circuit of claim 1, wherein the reference memory cell and other identical reference memory cells inside the same layout bank are connected in parallel to generate the reference current.

* * * * *